United States Patent
Balzano

(10) Patent No.: US 7,154,371 B1
(45) Date of Patent: Dec. 26, 2006

(54) NEGATIVE TEMPERATURE COEFFICIENT ATTENUATOR

(76) Inventor: Alfiero Balzano, 11371 Monarch St., Garden Grove, CA (US) 92841

( * ) Notice: Subject to any disclaimer, the term of this patent is extended or adjusted under 35 U.S.C. 154(b) by 207 days.

(21) Appl. No.: 10/985,258

(22) Filed: Nov. 10, 2004

Related U.S. Application Data

(60) Provisional application No. 60/525,714, filed on Dec. 1, 2003.

(51) Int. Cl.
*H01C 7/10* (2006.01)

(52) U.S. Cl. .............................. 338/22 SD; 338/22 R; 338/28

(58) Field of Classification Search ................ 338/8, 338/22 R, 22 SD, 23–25, 28–40, 216; 257/467, 257/712, 724; 361/106, 695
See application file for complete search history.

(56) References Cited

U.S. PATENT DOCUMENTS

| | | | |
|---|---|---|---|
| 2,782,377 A * | 2/1957 | Selby ........................... 333/26 |
| 3,444,399 A * | 5/1969 | Jones ........................... 307/117 |
| 4,510,482 A * | 4/1985 | McClanahan et al. ......... 338/24 |
| 4,930,353 A * | 6/1990 | Kato et al. ..................... 73/727 |
| 5,477,417 A * | 12/1995 | Ohmori et al. ............. 361/695 |

* cited by examiner

*Primary Examiner*—Tu Hoang
(74) *Attorney, Agent, or Firm*—Stetina Brunda Garred & Brucker

(57) ABSTRACT

A temperature tracking attenuator includes a substrate having a circuit chip with electrical connections providing a thermal interface with adjacent circuitry providing an attenuator component package. The package comprises a thermal layer on one side which is adhesively joined to the underside of an insulative layer with the exposed side of the insulative layer having an output connector, an input connector, and a circuit ground connector. A pocket in the layers receives an attenuator chip that includes an input tab, an output tab and a ground tab, which are indexed and registered with the input connector, the output connector and the circuit ground connector. A spring pressure clip, which constitutes ground, is pressed over the edge of the package where one leg of the clip engages with the circuit ground connector and the other leg of the clip connects to the underside of the thermal layer.

12 Claims, 2 Drawing Sheets

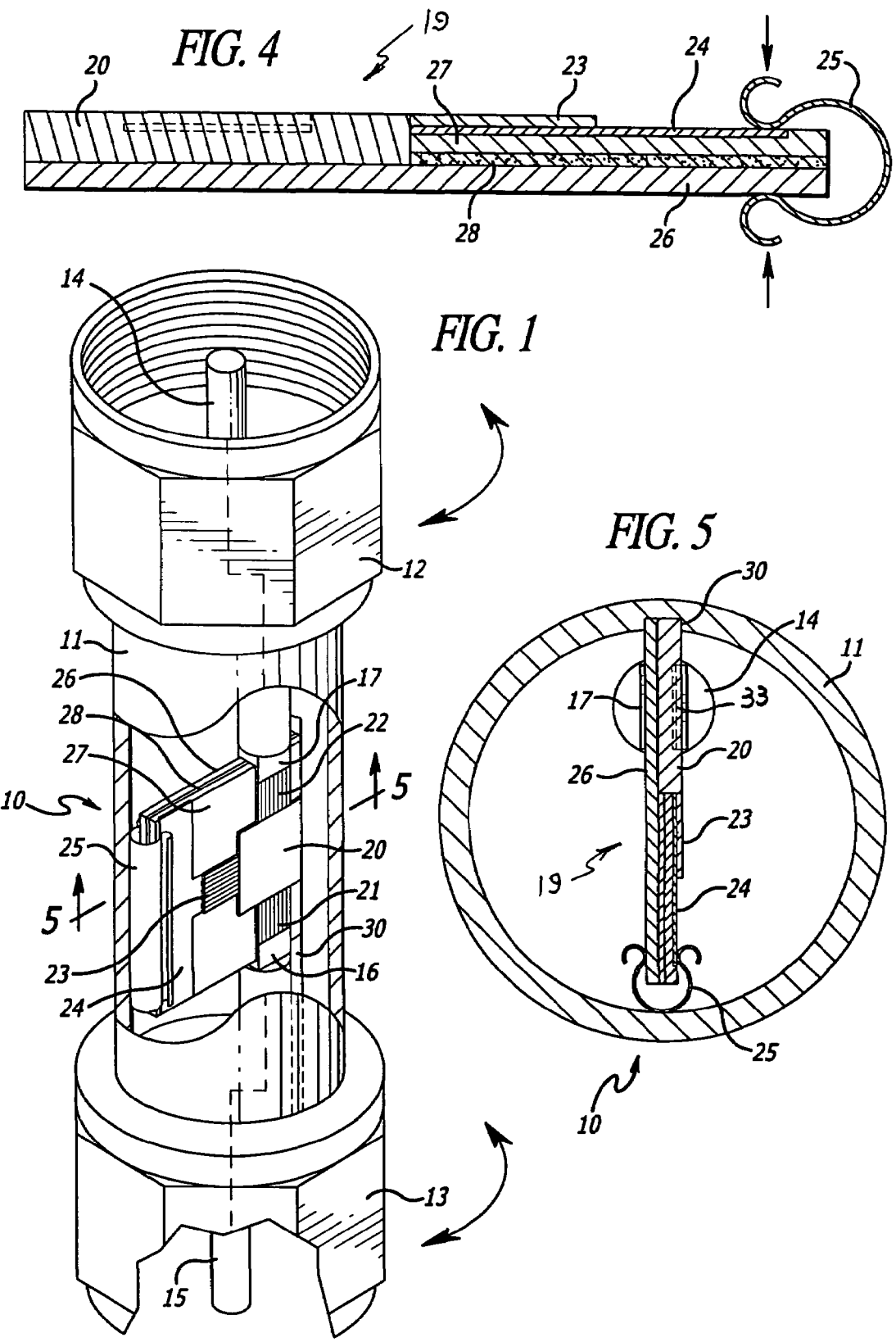

NEGATIVE TEMPERATURE COEFFICIENT ATTENUATOR

Priority claimed on Ser. No. 60/525,714 filed Dec. 1, 2003 pending.

BACKGROUND OF THE INVENTION

1. Field of the Invention

The present invention relates to the field of temperature tracking and attenuation, and more particularly to a novel multi-layered temperature sensing interconnect substrate providing an in-line electronic component that maintains stable attenuation over varying temperature ranges.

2. Brief Description of the Prior Art

In the past, conventional electronic circuitry has encountered problems and difficulties for assuring proper signal clarity and strength at high frequencies. Attempts have been made to solve these problems by providing a controlled signal attenuation in the circuit. However, in the current advanced high-speed signal technology, there is a requirement for circuit operation over a wide range of temperatures while maintaining accurate signal attenuation. Such conventional circuitry is extremely expensive and labor intensive to produce.

Therefore, a need has existed to provide a temperature tracking attenuator that assembles an electronic attenuator chip in a laminated substrate so as to allow accurate thermal sensing and electronic tracking of temperature variations while maintaining absolute circuit ground and with circuit connections with the attenuator chip.

SUMMARY OF THE INVENTION

Accordingly, the above problems and difficulties are avoided by the present invention which provides a temperature tracking attenuator which attains the above objectives by development of a multi-layered substrate allowing for installation of a circuit chip so that its mounting and electrical connections provide a thermal interface with adjacent circuitry so that the components are integrated in an attenuator component package. Initially, the component package comprises a thermal conductive composite layer on one side of the package, which is adhesively joined to the underside of an insulative layer with the exposed side of the insulative layer having an output connector, an input connector, and a circuit ground connector. Both the adhesive layer and the insulation layer have a cut-out forming a pocket for insertably receiving a conventional attenuator chip. The chip includes an input tab, an output tab and a ground tab, which are indexed and registered with the input connector, the output connector and the circuit ground connector when the chip is assembled in the pocket. The tabs of the attenuator chip are soldered to the respective connectors to form a mechanical and electrical connection. To complete the package, a spring pressure clip, which constitutes ground, is pressed over the edge of the package so as to have one leg of the clip engaged with the circuit ground connector and the other leg of the clip connected to the underside of the thermal conductive composite layer. The attenuator package is then slidably inserted into an electrical component having a body with opposite connectors that are rotatably mounted on opposite ends of the body. The body includes a slot for slidably receiving the edge of the attenuator package, while the pressure ground clip slidably engages with an interior wall surface of the body. Each of the end connectors of the component includes yoke members which provide an interference fit with the input and output connectors of the package. The completely assembled component can now be introduced into an appropriate electrical circuit.

Therefore, it is among the primary objects of the present invention to provide a temperature tracking attenuator which allows the signal strength to remain constant as the temperature changes so as to eliminate the need for complicated and less reliable, expensive A G C loops that also consume needed DC power.

Another object of the present invention is to provide a temperature tracking attenuator composed of a multi-layered substrate permitting for a circuit chip space mounting an electrical connection while securing a thermal interface which is integrated in a final easily manageable attenuator component package.

Yet another object of the present invention is to provide a unique, multi-layered interconnected substrate which includes temperature tracking emulation chip technology by providing an in-line electronic component which maintains stable attenuation over varying temperature ranges.

Still a further object resides in providing a negative temperature coefficient attenuator employing thermal management material in order to secure balance electronic attenuation over temperature variance.

BRIEF DESCRIPTION OF THE DRAWINGS

The features of the present invention which are believed to be novel are set forth with particularity in the appended claims. The present invention, both as to its organization and manner of operation, together with further objects and advantages thereof, may best be understood with reference to the following description, taken in connection with the accompanying drawings in which:

FIG. 1 is an enlarged perspective view, partly in section, of an electronic component attenuation package incorporating the present invention;

FIG. 4 is a transverse, cross-sectional view of the attenuator package illustrated in FIG. 2, as taken in the direction of arrows 4—4 thereof; and FIG. 5 is a transverse, cross-sectional view of the component and attenuator package taken in the direction of arrows 5—5 of FIG. 1.

DESCRIPTION OF PREFERRED EMBODIMENT

Figure 3:
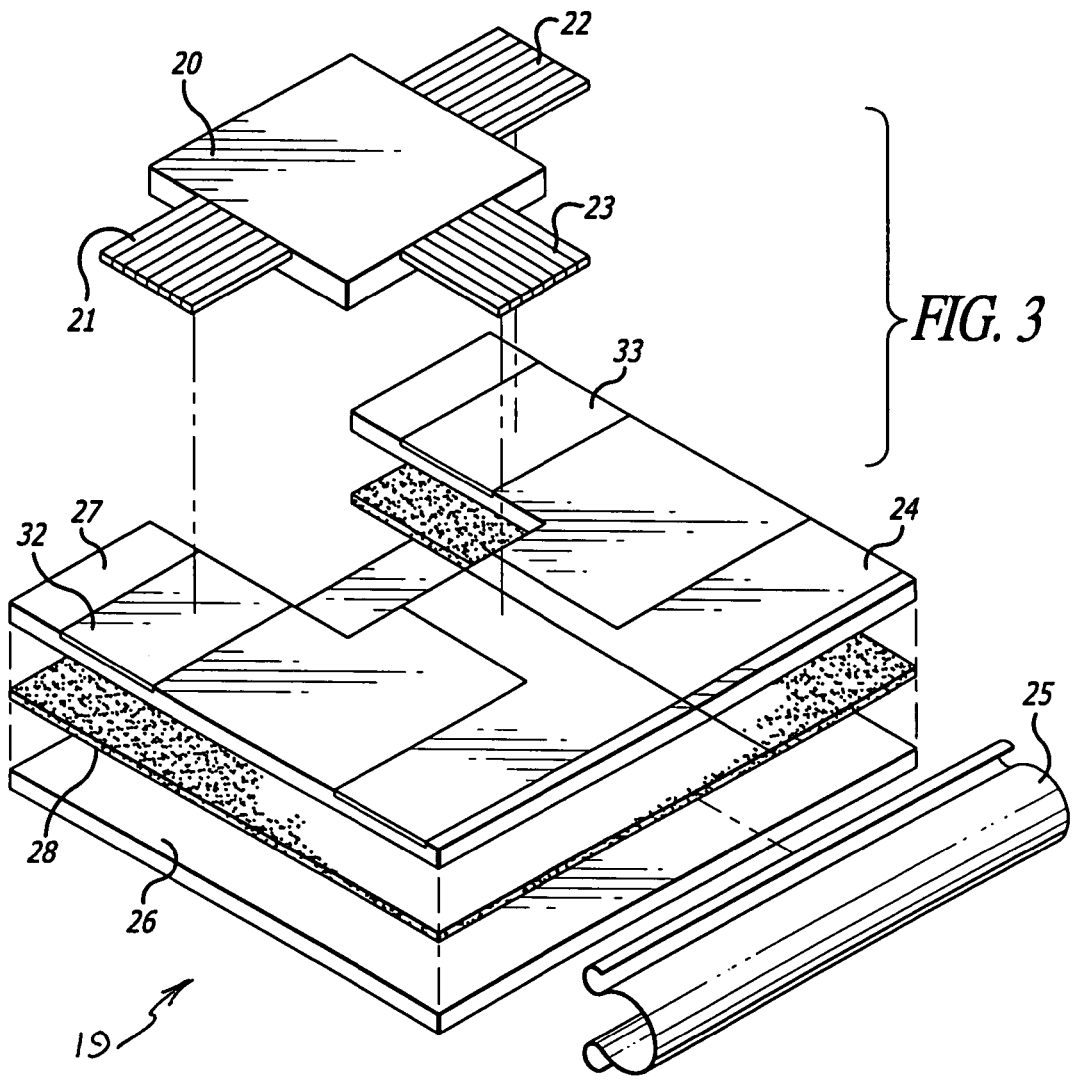
FIG. 3 is an exploded perspective view of the attenuator package shown in FIG. 2.

Referring to FIG. 1, the novel negative temperature coefficient attenuator is illustrated in the general of arrow 10 which includes an elongated cylindrical body 11, having opposite ends with a rotatable coupling at each end as represented by numerals 12 and 13 respectively. An electrode 14 is exposed through the threaded end of coupling 12, while electrode 15 is exposed through coupling 13. The opposite end of each of the respective electrodes terminates in a Y-shaped lug represented by numerals 16 and 17. It is to be understood that the opposite opposing ends of the spaced-apart electrodes includes the Y-shaped yoke indicated by numerals 16 and 17. Also, the electrodes may take the form of a connector post, socket or the like. The opposing spaced-apart ends of the electrodes 14 and 15 terminate in the lugs 16 and 17 which form an interference fit with the opposite sides of a circuit package 19 formed as a unit.

The package supported by lugs 16 and 17 includes an attenuator chip 20 having an input tab 21, a output tab 22, and a ground tab 23. The electrodes 14 and 15 are in mechanical and electrical contact with the input and output tabs via the lugs 16 and 17 respectively. The ground tab 23 is in electrical and mechanical engagement with a ground connector strip indicated by numeral 24. A ground clip 25 has a pair of legs which bear against the ground connector strip 24 and a thermal composite layer 26. An insulation layer 27 supports the connector strip and the chip 20 as well as insulating the connectors from the thermal conductive layer 26. An adhesive layer 28 joins the thermal conductive layer to the underside of the insulation layer 27. A groove 30 formed in the inner surface of the wall of body 11 permits the opposite edge of the package from the edge carrying clip 25 to be inserted through the end of the body and slid forward toward electrode 14 so that the lug 17 engages in an interference fit with the connector tab 22. Once installed, the electrode 15 is then pressed into the body so that lug 16 engages in an interference fit with the input tab 21.

Figure 2:
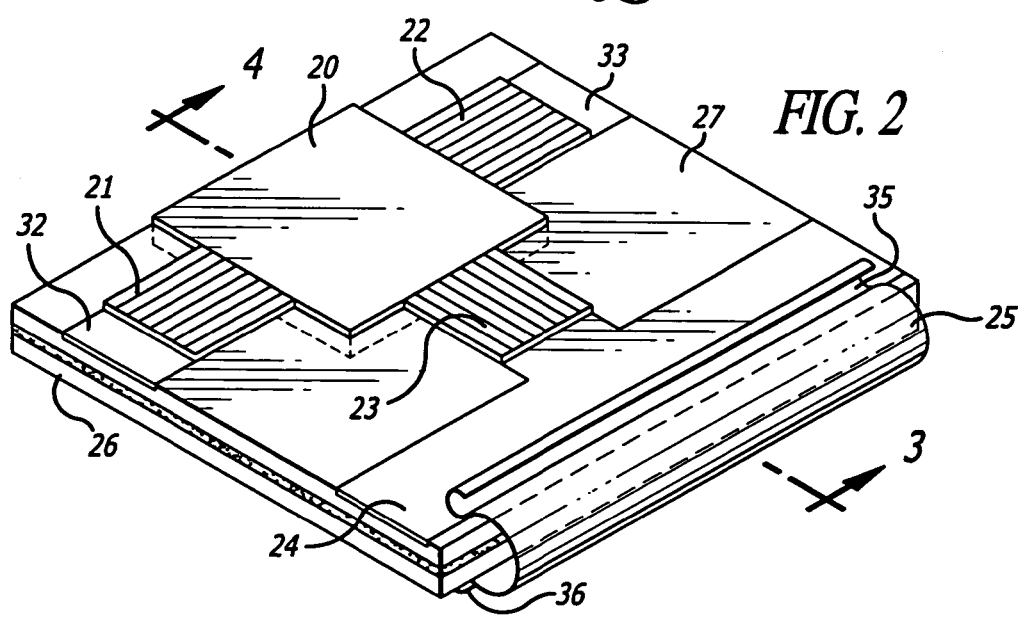
FIG. 2 is a perspective view of the attenuator package utilized in the component of FIG. 1.

Referring now to FIGS. 2 and 3, the attenuator package is illustrated in its assembled condition in FIG. 2 and in its pre-assembly condition shown in FIG. 3. It can be seen that the thermal conductive composition layer 26 is attached to the underside of the insulation layer 27 by the adhesive layer 28. Both the adhesive layer and the insulative layer include a recess or cut-out defined as a chip pocket for receiving the attenuator chip 20. The insulation layer 27 includes three conductors identified as input conductor 32, output conductor 33 and the previously described circuit ground conductor strip 24. The tabs 21, 22 and 23, are secured to the respective connectors by soldering so that a mechanical and electrical connection is produced. A portion of the input and output connectors 32 and 33 are exposed beyond the terminating edge of input and output tabs 21 and 22 so that when the package is inserted into the hollow of body 11 along track 30, the respective lugs 16 and 17 can be attached to these exposed portions by interference fit. Preferably, the insulation layer and the thermal conductive composite layer are joined together as a laminate with the chip connectors applied to the exposed connector surfaces of the insulation layer so as to be flush with the surface thereof. Once the layers or laminates are secured, the pressure ground clip 25 may be inserted along the edge marginal region of the laminate so that a leg 35 engages with the ground connector 24. The opposite leg 36 bears against the edge marginal region of the thermal conductive composite layer 26.

Referring now in detail to FIG. 4, it can be seen that the package including the thermal conductive layer, connectors and the chip 20, including the clip 25, form a complete and integral package which may now be slid into place within the hollow cavity of the body 11. It should be emphasized that the whole conductive composite layer 26 is composed of a carbon composite material, and that such material is described in U.S. Pat. No. 6,257,329, so that a unique, multi-layered interconnect substrate and temperature tracking device is produced. The temperature tracking attenuator is an in-line electronic component that maintains stable attenuation over varying temperature ranges.

Referring now in detail to FIG. 5, it can be seen that the electrode lugs, such as the Y-shaped lug 17, captures the package by engaging with the exposed connector portion of the connector 33 while the lug 16 will engage with and have an interference fit with the exposed portion of the input connector 32. Also, it can be seen that the ground circuit clip 25 has a bowed or circular portion which engages with the inner surface of the wall structure of body 11 which completes the electrical circuit. Also, the edge marginal region opposite from the edge marginal region carrying the clip 25 is inserted into the groove 30 so that the entire attenuator package is captured within the hollow cavity of the body 11.

The electronic attenuator for application over a temperature variance is achieved by the present invention. To assure proper electronic signal clarity and strength at high temperatures, the present device controls signal attenuation by having the chip 20 respond to the sensing of temperature changes by the thermal composite material 26. It should be particularly noted from the illustrations that the underside of chip 20 resides in contact with a substantial portion of the surface area of the thermal composite material. Sensitivity to varying temperature ranges is achieved by the employment of a multi-layered package substrate allowing for a circuit chip space or pocket 31 and by mounting electrical connections on the insulative layer while securing thermal-interface, integrated in a final attenuator component package.

While particular embodiments of the present invention have been shown and described, it will be obvious to those skilled in the art that changes and modifications may be made without departing from this invention in its broader aspects and, therefore, the aim in the appended claims is to cover all such changes and modifications as fall within the true spirit and scope of this invention.

What is claimed is:

1. A variable temperature tracking attenuator comprising:
a housing having a pair of electrodes terminating with ends in opposing relationship;
an attenuator package disposed between said opposing ends of said electrodes;
said package includes a temperature sensing layer and an insulative layer, said insulative layer having at least three conductive strips disposed thereon in fixed spaced-apart relationship;
an electronic chip carried on said package having at least three connector leads coupled with and in registry with said conductive strips;
a resilient element detachably connectable with a selected one of said conductive strips and said temperature sensing layer and with a portion of said resilient element engaging said housing; and
said electronic chip responsive to temperature changes developed in said temperature sensing layer.

2. The temperature attenuator defined in claim 1 including:
an internal groove provided on said housing for slidably accepting insertion of said package along an edge marginal region thereof.

3. The temperature attenuator defined in claim 2 wherein:
said resilient element is a spring clip bearing against said housing and cooperating with said internal groove to removably retain said package with said housing.

4. The temperature attenuator defined in claim 3 wherein:
said temperature sensing layer is composed of a carbon composition.

5. The temperature attenuator defined in claim 4 wherein:
said spring clip constitutes an electrical ground in combination with said housing and said selected one of said conductive strips.

6. A negative temperature coefficient attenuator comprising:
a cylindrical housing having an internal cavity;
a first electrode and a second electrode carried on said housing and each of said electrodes having a terminating end so as to define a space therebetween;

an electronic package occupying said space and including a temperature sensing portion and an electronic chip being responsive to temperature variations of said temperature sensing portion; and electronic circuit means interconnecting said temperature sensing portion, said electronic chip and said housing together to provide attenuation of circuit operation in response to temperature variations.

7. The attenuator defined in claim 6 wherein:

said temperature sensing portion is composed of a carbon ingredient; and an insulative layer secured to said temperature sensing portion.

8. The attenuator defined in claim 7 wherein:

said electronic package includes a pocket provided in said temperature sensing layer and said insulative portion; and said electronic chip disposed in said pocket.

9. The attenuator defined in claim 8 including:

said insulative layer supporting conductive strips; and said electronic chip having at least a pair of leads in registry with and connected to selected ones of said conductive strips.

10. The attenuator defined in claim 9 including:

a conductive member detachably carried on said electronic package interconnecting said housing with said temperature sensing portion and a selected one of said conductive strips.

11. A temperature attenuator comprising:

a thermal conductive layer composed of a carbon material;

an electrical insulative layer adhesively secured to said thermal sensing layer;

at least three electrically conductive strips carried on said insulative layer in fixed spaced-apart relationship constituting an input connector, an output connector and a ground connector;

said insulative layer and said thermal conductive layer having a pocket provided between said three conductive strips;

an electronic attenuator chip disposed in said pocket and having an input tab engaging said input connector, an output tab engaging said output connector and a ground tab engaging said ground connector; and a resilient chip having a pair of legs with said legs engaging said ground connector and said thermal conductive layer respectively.

12. The temperature attenuator defined in claim 11 including:

said thermal conductive layer and said insulative layer including said electronic attenuator provide a unitary laminated sandwich construction;

a cylindrical housing enclosing said unitary sandwich construction; and a first electrode carried in said housing coupled with said input tab and a second electrode carried in said housing coupled with said output tab.

\* \* \* \* \*